(12) United States Patent
Uchida et al.

(10) Patent No.: US 10,129,983 B2
(45) Date of Patent: Nov. 13, 2018

(54) OPTICAL MODULE AND FLEXIBLE PRINTED CIRCUIT BOARD

(71) Applicant: Oclaro Japan, Inc., Kanagawa (JP)

(72) Inventors: Yoshikuni Uchida, Kanagawa (JP); Naohiko Baba, Tokyo (JP); Hideaki Asakura, Kanagawa (JP); Michihide Sasada, Kanagawa (JP); Kazuhiro Komatsu, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/862,693

(22) Filed: Jan. 5, 2018

(65) Prior Publication Data

US 2018/0235087 A1  Aug. 16, 2018

(30) Foreign Application Priority Data

Feb. 16, 2017 (JP) ................................ 2017-026873

(51) Int. Cl.
| | |
|---|---|
| *H05K 1/00* | (2006.01) |
| *H05K 1/18* | (2006.01) |
| *G02B 6/42* | (2006.01) |
| *H05K 1/11* | (2006.01) |
| *H05K 3/34* | (2006.01) |
| *H05K 1/03* | (2006.01) |

(52) U.S. Cl.
CPC .......... *H05K 1/189* (2013.01); *G02B 6/4245* (2013.01); *G02B 6/4262* (2013.01); *G02B 6/4279* (2013.01); *H05K 1/0393* (2013.01); *H05K 1/118* (2013.01); *H05K 3/3463* (2013.01); *H05K 2201/2009* (2013.01)

(58) Field of Classification Search
CPC ......... H01L 2924/00; H01L 2924/0002; H01L 2224/48091; H01L 2224/45124; H01L 2224/45144; H01L 2924/00014; H01L 2924/3011; H01L 23/055; H01L 23/10
See application file for complete search history.

(56) References Cited

U.S. PATENT DOCUMENTS

| | | | | |
|---|---|---|---|---|
| 5,774,614 A | * | 6/1998 | Gilliland | G02B 6/4224 385/88 |
| 7,030,477 B2 | * | 4/2006 | Ishimura | H01S 5/02212 257/664 |

(Continued)

FOREIGN PATENT DOCUMENTS

| | | |
|---|---|---|
| JP | 2007-156467 A | 6/2007 |
| JP | 2016-181584 A | 10/2016 |

*Primary Examiner* — Yuriy Semenenko
(74) *Attorney, Agent, or Firm* — Mattingly & Malur, PC (57) ABSTRACT

A base material includes a pair of end regions located on both sides in a first direction, and an intermediate region located between the pair of end regions. The intermediate region includes a pair of side edges on both sides in a second direction orthogonal to the first direction. Both the pair of side edges do not project outward in the second direction from the pair of end regions. At least one of the pair of side edges has a shape recessed inward in the second direction from the pair of end regions. Terminals include end pads and a side pad. The end pads are located in each of the pair of end regions of the base material and arranged in the second direction. The side pad is located at at least one of the pair of side edges of the base material.

16 Claims, 5 Drawing Sheets

(56) References Cited

U.S. PATENT DOCUMENTS

| | | | |
|---|---|---|---|
| 7,439,449 B1* | 10/2008 | Kumar | G02B 6/4292 |
| | | | 174/254 |
| 8,380,080 B2* | 2/2013 | Kawaguchi | H05K 1/0234 |
| | | | 398/135 |
| 2005/0045374 A1* | 3/2005 | Kumar | H05K 1/118 |
| | | | 174/254 |
| 2007/0147745 A1 | 6/2007 | Fujimura | |
| 2007/0177884 A1* | 8/2007 | Kagaya | H03F 3/087 |
| | | | 398/202 |
| 2010/0006863 A1* | 1/2010 | Ban | H01L 31/0203 |
| | | | 257/81 |
| 2016/0286657 A1 | 9/2016 | Ban | |
| 2017/0264074 A1* | 9/2017 | Noguchi | H01S 5/02276 |
| 2017/0276889 A1* | 9/2017 | Baba | G02B 6/4256 |

* cited by examiner

OPTICAL MODULE AND FLEXIBLE PRINTED CIRCUIT BOARD

CROSS-REFERENCE TO RELATED APPLICATION

The present application claims priority from Japanese application JP2017-026873 filed on Feb. 16, 2017, the content of which is hereby incorporated by reference into this application.

BACKGROUND OF THE INVENTION

1. Field of the Invention

The present invention relates to an optical module and a flexible printed circuit board.

2. Description of the Related Art

Miniaturization and high density of optical modules have advanced. Accordingly, high density of optical subassemblies (OSAs) accommodated in the optical module and having the function of the optical transmitting and/or the function of the optical receiving has advanced in the same manner. Although four OSAs each with a single channel have been conventionally disposed on each of the transmission side and the reception side because of, for example, an increase in transmission speed (100 Gbps, etc.) due to wavelength multiplexing, an OSA with four channels contained in one package is recently used (JP 2016-181584 A).

When a plurality of channels are contained in the OSA, the number of electrical terminals for connecting the OSA with the outside increases according to the channels. The OSA is connected with a printed circuit board (PCB), on which a control integrated circuit (IC) and the like are disposed, in the optical module using a flexible printed circuit board (FPC). Due to an increase in the number of electrical terminals of the OSA, the number of wirings and the number of pads (connection terminals or electrode pads) of the FPC also increase.

A connection pad of the FPC is usually wide compared to a wiring. This is for the purpose of, for example, increasing the connection strength between the PCB and the FPC. An increase in the number of wirings (alternating current (AC), direct current (DC), ground (GND), etc.) in the FPC increases the number of connection pads, resulting in the expansion of a region occupied by the connection pads. Specifically, the connection pads are provided along the side of an end of the FPC in the extending direction thereof. The increase in the number of connection pads leads to widening of the width (hereinafter, lateral width) in a direction vertical to the extending direction. The wider the lateral width of the FPC is, the wider the corresponding connection pad region on the PCB is; however, it is difficult to dispose a sufficient connection pad region because miniaturization of the optical module itself also has advanced.

In FIG. 2 in JP 2007-156467 A, an example is disclosed, in which connection pads are disposed at the sides near connection pads at the end. In this disposition, the maximum value of the width in connecting the FPC with the PCB is the gap between the connection pads at the sides, and thus it is impossible to avoid an increase in the lateral width of the FPC.

SUMMARY OF THE INVENTION

It is an object of the invention to provide an FPC in the form in which the FPC can be efficiently connected without widening the lateral width even when the number of connection terminals of the FPC increases, and an optical module using the FPC.

(1) An optical module according to an aspect of the invention includes: an optical subassembly for converting an optical signal and an electric signal from at least one to the other; a printed circuit board; and a flexible printed circuit board connecting the optical subassembly with the printed circuit board, the flexible printed circuit board including a base material and a wiring pattern, the wiring pattern including a plurality of terminals at a periphery on at least one surface of the base material, the base material including a pair of end regions located on both sides in a first direction, and an intermediate region located between the pair of end regions, the intermediate region including a pair of side edges on both sides in a second direction orthogonal to the first direction, both the pair of side edges not projecting outward in the second direction from the pair of end regions, at least one of the pair of side edges having a shape recessed inward in the second direction from the pair of end regions, the plurality of terminals including a plurality of end pads and a side pad, the plurality of end pads being located in each of the pair of end regions of the base material and arranged in the second direction, the side pad being located at the at least one of the pair of side edges of the base material.

According to the aspect of the invention, the side pad is also used for electrical connection, and therefore, the number of end pads arranged in the second direction (width direction) can be reduced, which can reduce widening of the width of the flexible printed circuit board.

(2) The optical module according to (1), wherein the side pad may be a plurality of side pads located at the at least one of the pair of side edges of the base material and arranged in the first direction.

(3) The optical module according to (2), wherein the pair of end regions may include a first end region and a second end region, and the wiring pattern may include a plurality of wiring lines connecting some of the plurality of end pads located in the first end region with at least some of the plurality of end pads located in the second end region.

(4) The optical module according to (3), wherein the plurality of wiring lines may be configured so as to allow a signal of 10 Gbps or more to transmit therethrough.

(5) The optical module according to (4), wherein the plurality of wiring lines may constitute a multichannel differential transmission path.

(6) The optical module according to any one of (3) to (5), wherein the wiring pattern may include a ground plane, and the plurality of end pads may include a group of signal pads connected to the plurality of wiring lines, and a plurality of ground pads connected to the ground plane.

(7) The optical module according to (6), wherein the plurality of ground pads may be disposed so as to interpose the group of signal pads therebetween in the second direction.

(8) The optical module according to (6) or (7), wherein the plurality of end pads located in the first end region may include a group of control pads, and the wiring pattern may include another plurality of wiring lines connecting the group of control pads with the plurality of side pads.

(9) The optical module according to (8), wherein the plurality of ground pads located in the first end region may be disposed so as to interpose the group of control pads therebetween in the second direction.

(10) The optical module according to (9), wherein at least one of the ground pads may be disposed between the group of signal pads and the group of control pads located in the first end region.

(11) The optical module according to any one of (3) to (10), wherein the plurality of side pads may be located at a position closer to the second end region than the first end region.

(12) The optical module according to any one of (3) to (11), wherein the first end region may be larger in the second direction than the second end region.

(13) The optical module according to any one of (2) to (12), wherein both the pair of side edges of the intermediate region may have a shape recessed inward in the second direction from the pair of end regions.

(14) The optical module according to any one of (2) to (13), wherein the optical subassembly may be connected to the plurality of end pads located in the first end region, and the printed circuit board may be connected to the plurality of end pads located in the second end region and the plurality of side pads located in the intermediate region.

(15) The optical module according to any one of (2) to (14), wherein the plurality of side pads maybe configured so as to allow a signal or DC voltage of 1 MHz or less to be input thereto. (16) A flexible printed circuit board according to an aspect of the invention includes: a base material; and a wiring pattern including a plurality of terminals at a periphery on at least one surface of the base material, the base material including a pair of end regions located on both sides in a first direction, and an intermediate region located between the pair of end regions, the intermediate region including a pair of side edges on both sides in a second direction orthogonal to the first direction, both the pair of side edges not projecting outward in the second direction from the pair of end regions, at least one of the pair of side edges having a shape recessed inward in the second direction from the pair of end regions, the plurality of terminals including a plurality of end pads and a plurality of side pads, the plurality of end pads being located in each of the pair of end regions of the base material and arranged in the second direction, the plurality of side pads being located at the at least one of the pair of side edges of the base material and arranged in the first direction.

According to the aspect of the invention, the side pads are included for electrical connection, and therefore, the number of end pads arranged in the second direction (width direction) can be reduced, which can reduce widening of the width of the flexible printed circuit board.

DETAILED DESCRIPTION OF THE INVENTION

Hereinafter, embodiments of the invention will be described with reference to the drawings. The same or equivalent elements are denoted by the same reference numeral and sign in the drawings, and a redundant description is omitted.

Figure 1:
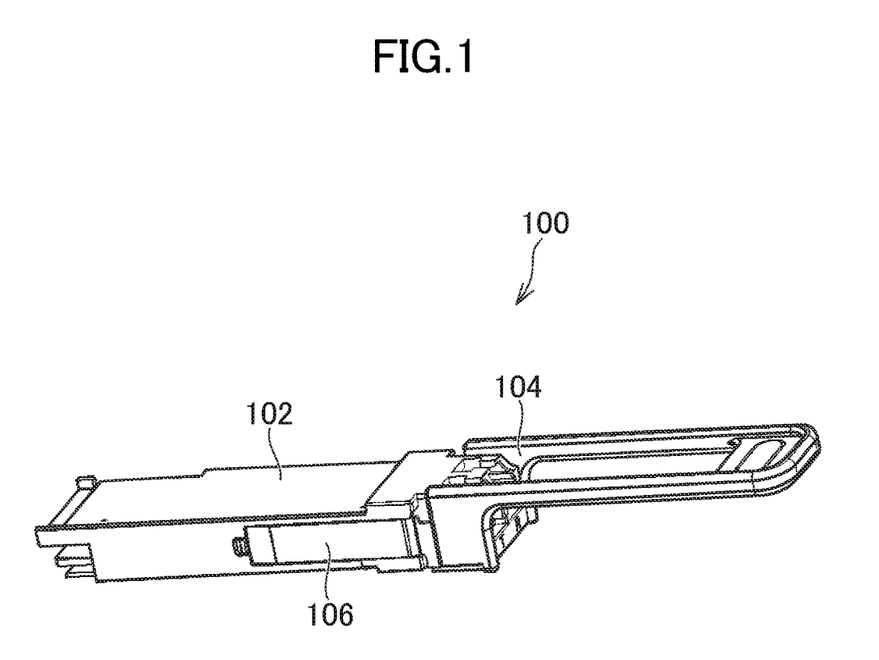
FIG. 1 is an external view of an optical module according to an embodiment of the invention.

FIG. 1 is an external view of an optical module according to an embodiment of the invention. An optical module 100 is an optical transceiver having the functions of the optical transmitting and the optical receiving at a bit rate of 100-Gbit/s class, and is compliant with the quad small form-factor pluggable 28 (QSFP28) multi-source agreement (MSA) standards. The external shape of the optical module 100 is composed of components including a case 102, a pull tab 104, and a slider 106.

Figure 2:
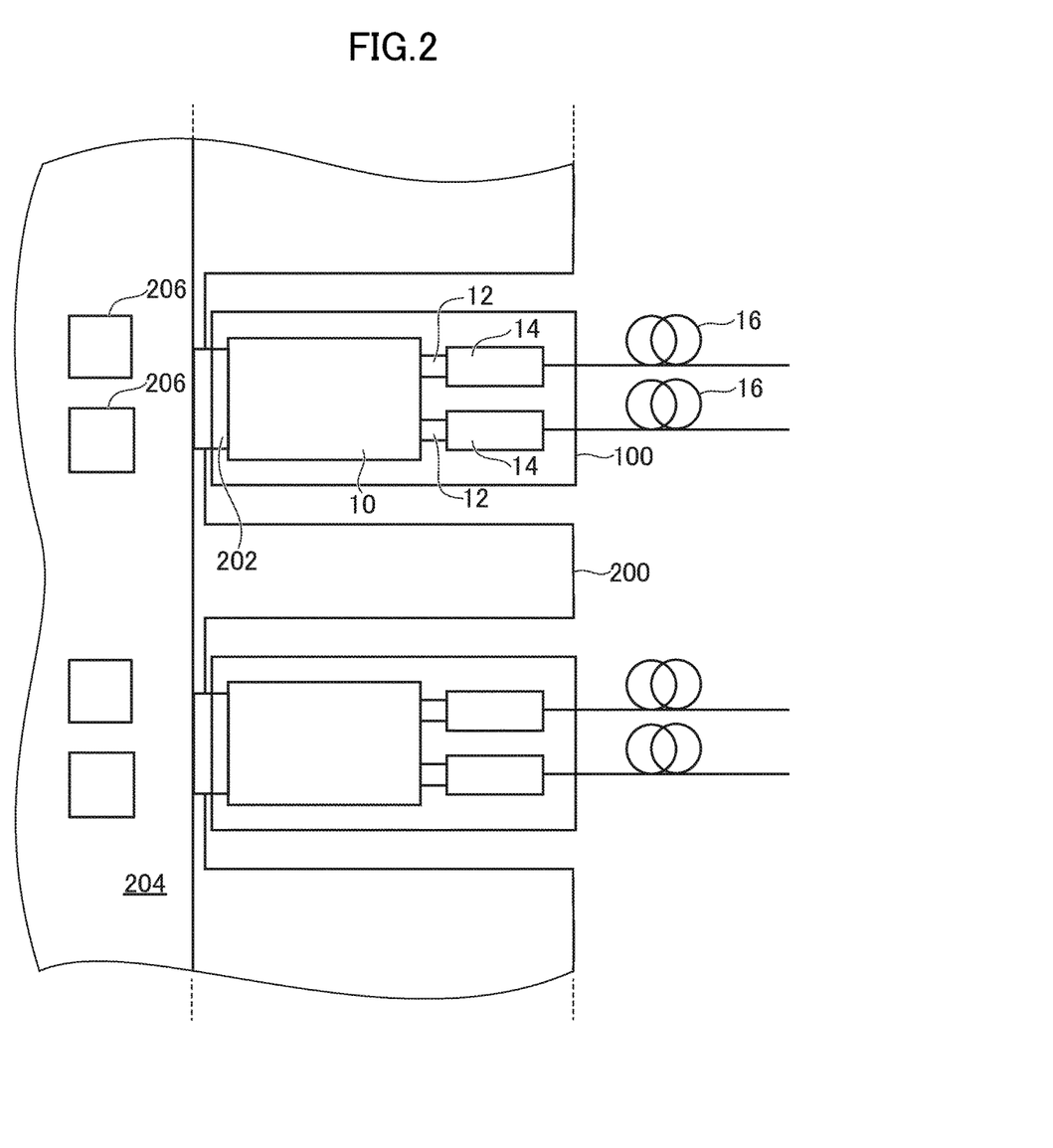
FIG. 2 is a schematic view showing the configuration of an optical transmission equipment to which the optical modules according to the embodiment of the invention are attached.

FIG. 2 is a schematic view showing the configuration of an optical transmission equipment to which the optical modules according to the embodiment of the invention are attached. Each of the plurality of optical modules 100 is attached to an optical transmission equipment 200 through an electric port 202. The optical transmission equipment 200 is, for example, a high-capacity router or switch. The optical transmission equipment 200 has the function of, for example, an exchange, and is disposed in a base station or the like. The optical transmission equipment 200 obtains reception data (reception electric signal) from the optical module 100, determines what data to transmit where using ICs 206 or the like mounted on a circuit board 204, generates transmission data (transmission electric signal), and transfers the data to the corresponding optical module 100.

The optical module 100 includes a printed circuit board 10, flexible printed circuit boards 12, and optical subassemblies 14 each for converting an optical signal and an electric signal from at least one to the other. The printed circuit board 10 is an inflexible rigid board. The printed circuit board 10 and the optical subassembly 14 are connected through the flexible printed circuit board 12. An electric signal is transmitted from the printed circuit board 10 to the optical subassembly 14 through the flexible printed circuit board 12. Moreover, an electric signal is transmitted from the optical subassembly 14 to the printed circuit board 10 through the flexible printed circuit board 12. An optical conversion element included in the optical subassembly 14 is an element that converts an optical signal and an electric signal from one to the other. The optical conversion element that converts an electric signal to an optical signal is a light-emitting element. The optical conversion element that converts an optical signal to an electric signal is a light-receiving element. The optical subassembly 14 includes at least one of (e.g., both) the light-emitting element and the light-receiving element. An optical fiber 16 is connected to the optical subassembly 14 for inputting/outputting an optical signal.

Figure 3:
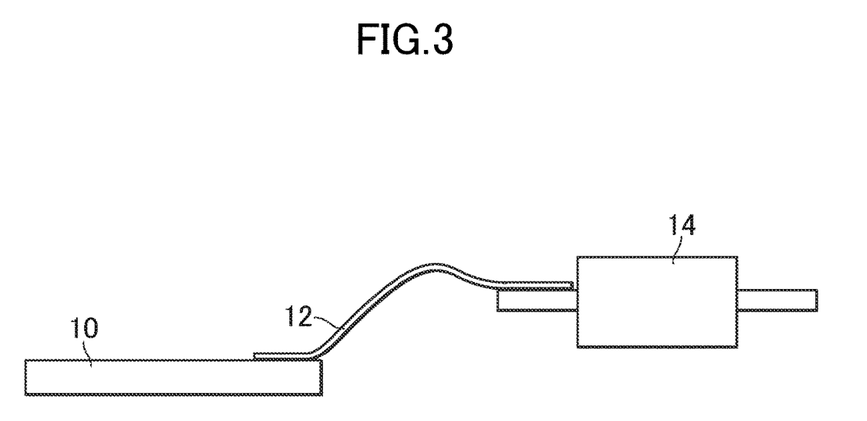
FIG. 3 is a schematic view showing an optical subassembly, a printed circuit board, and a flexible printed circuit board.

FIG. 3 is a schematic view showing the optical subassembly, the printed circuit board, and the flexible printed circuit board. The optical subassembly 14 is connected to one of ends of the flexible printed circuit board 12. The other end of the flexible printed circuit board 12 overlaps the printed circuit board 10 and is electrically connected thereto.

Figure 4:
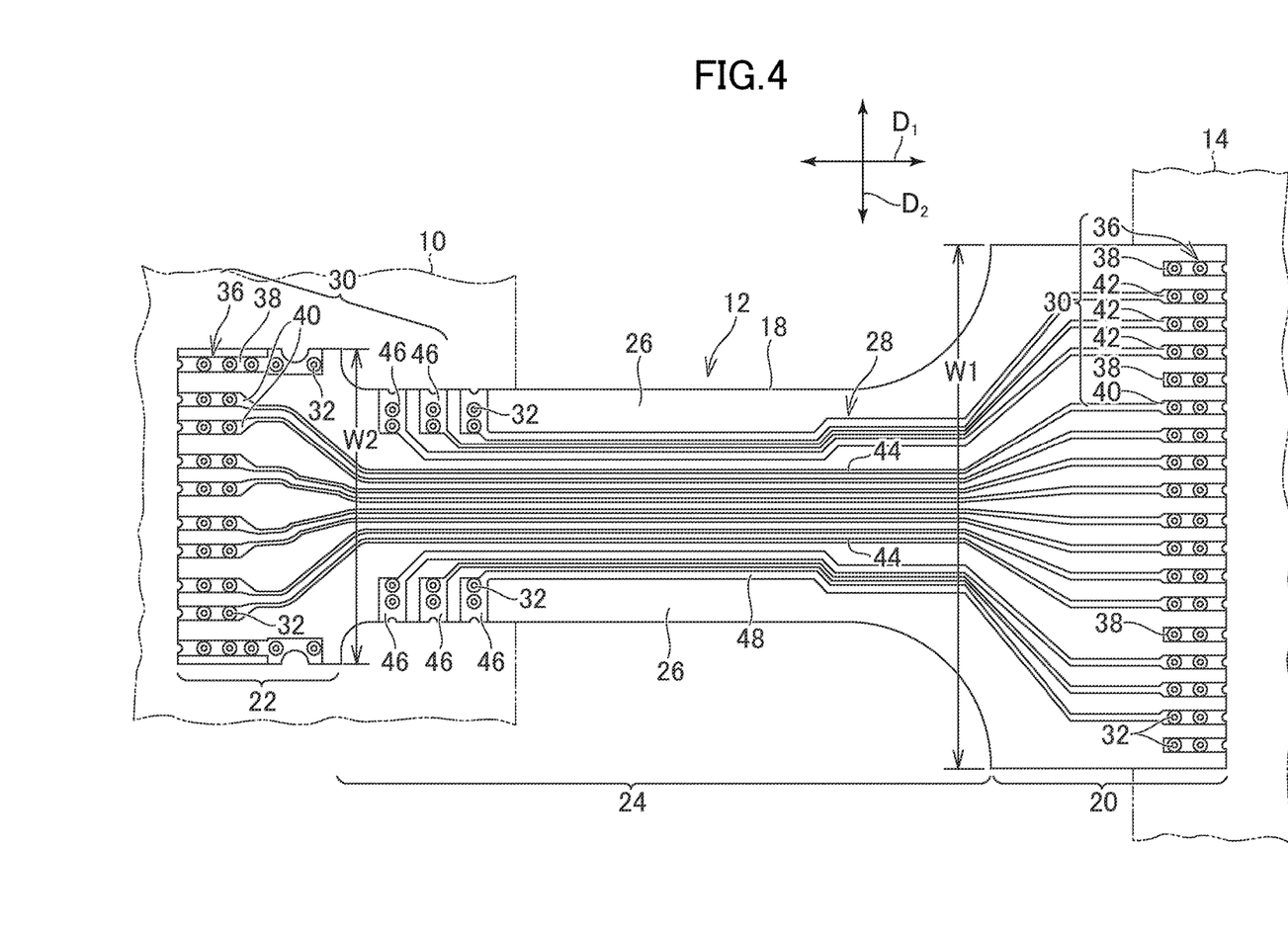
FIG. 4 is a diagram showing a front surface of the flexible printed circuit board according to an embodiment to which the invention is applied.
Figure 5:
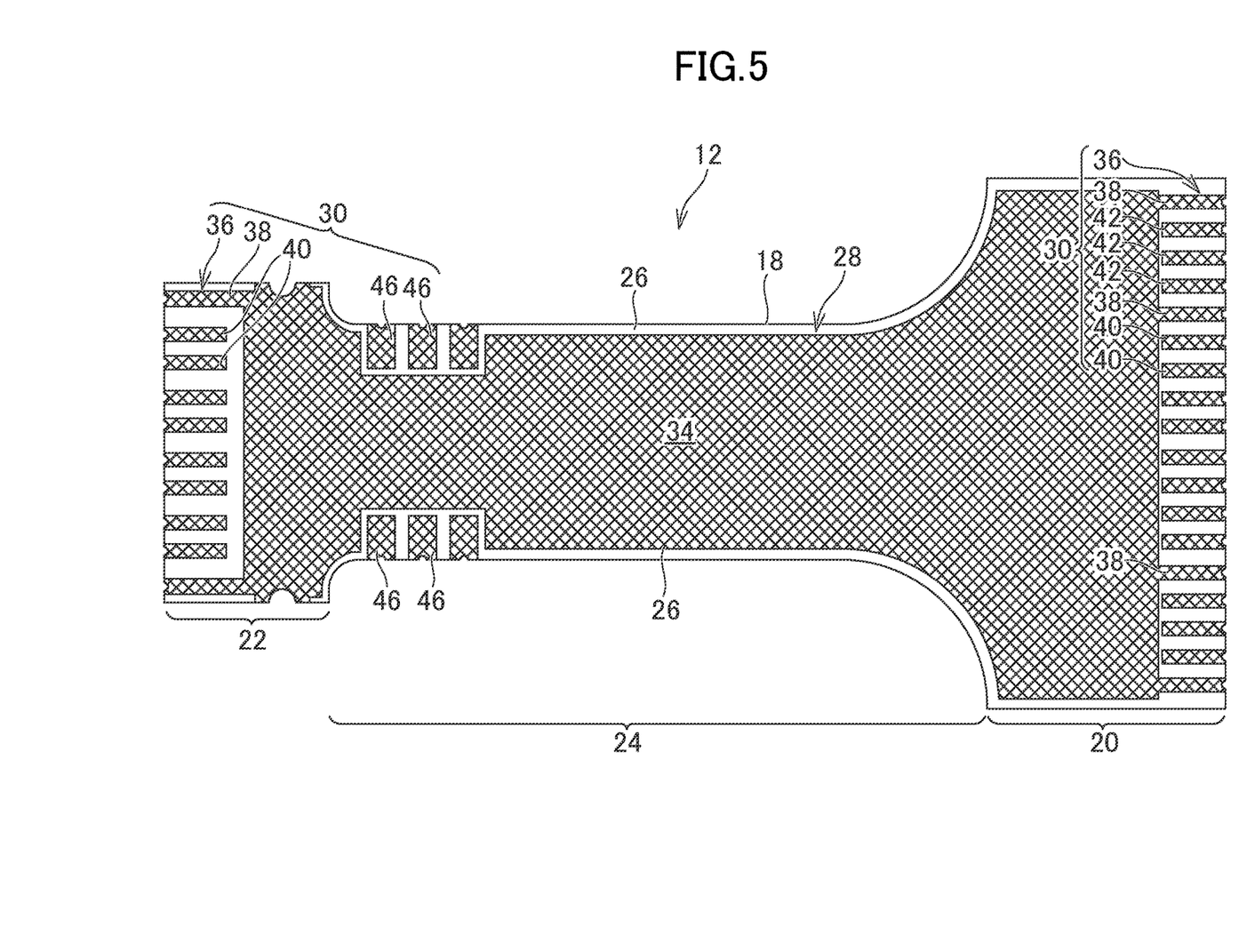
FIG. 5 is a diagram showing a back surface of the flexible printed circuit board shown in FIG. 4.

FIG. 4 is a diagram showing a front surface of the flexible printed circuit board according to an embodiment to which the invention is applied. FIG. 5 is a diagram showing a back surface of the flexible printed circuit board shown in FIG. 4.

The flexible printed circuit board 12 has a stacked structure in which copper foil/copper plating constituting a wiring pattern 28, to be described later, and the like is applied to a base material 18 and a coverlay is bonded to a surface layer. Although an example in which copper foil/copper plating is formed on both surfaces of the base material is described in the embodiment, the invention can be applied also to a structure in which copper foil is formed on a plurality of base materials and between the plurality of base materials. The base material 18 has softness because its thinness and raw material. The base material 18 includes a pair of end regions (a first end region 20 and a second end region 22) located on both sides in a first direction D1 (length direction). One of the first end region 20 and the second end region 22 is larger in a second direction D2 (width direction) orthogonal to the first direction D1 than the other. For example, a width W1 of the first end region 20 is larger than a width W2 of the second end region 22. The widths are not limited to those described above. The width W1 of the first end region 20 and the width W2 of the second end region may be the same, or the width W2 may be larger than the width W1.

The base material 18 includes an intermediate region 24 located between the first end region 20 and the second end region 22. The intermediate region 24 includes a pair of side edges 26 on both sides in the second direction D2. Both the pair of side edges 26 of the intermediate region 24 have a shape not projecting outward in the second direction D2 from the first end region 20 and the second end region 22. At least one of (e.g., both) the pair of side edges 26 of the intermediate region 24 has a shape recessed inward in the second direction D2 from the first end region 20 and the second end region 22. That is, the base material 18 has a constricted shape in the intermediate region 24.

The flexible printed circuit board 12 includes the wiring pattern 28 provided on at least one surface (e.g., both surfaces) of the base material 18. The wiring pattern 28 includes a plurality of terminals 30 at the periphery on at least one surface of the base material 18. As shown in FIGS. 4 and 5, the plurality of terminals 30 are provided on both surfaces of the base material 18. The terminal 30 provided on one surface of the base material 18 is connected to the corresponding terminal 30 provided on the other surface through a through-hole 32 (via) penetrating the base material 18. As shown in FIG. 5, the wiring pattern 28 includes a ground plane 34 on the other surface of the base material 18. The ground plane 34 is disposed spaced apart from the plurality of terminals 30. However, as will be described later, a portion of the plurality of terminals 30 is connected to the ground plane 34.

The plurality of terminals 30 include a plurality of end pads 36. The plurality of end pads 36 are located in each of the first end region 20 and the second end region 22 of the base material 18. The plurality of end pads 36 are arranged in the second direction D2. The optical subassembly 14 is connected to the plurality of end pads 36 located in the first end region 20. The printed circuit board 10 is connected to the plurality of end pads 36 located in the second end region 22.

The plurality of end pads 36 located in the first end region 20 include a plurality of ground pads 38 connected to the ground plane 34. The plurality of end pads 36 located in the first end region 20 include a group of signal pads 40. At least two of the plurality of ground pads 38 are disposed so as to interpose the group of signal pads 40 therebetween in the second direction D2. The plurality of end pads 36 located in the first end region 20 include a group of control pads 42 to drive or control the optical subassembly 14. At least two of the plurality of ground pads 38 are disposed so as to interpose the group of control pads 42 therebetween in the second direction D2. Moreover, at least one ground pad 38 is disposed between the signal pad 40 and the control pad 42.

As shown in FIG. 5, the plurality of end pads 36 located in the second end region 22 include the plurality of ground pads 38 connected to the ground plane 34. The plurality of end pads 36 located in the second end region 22 include the group of signal pads 40. In the second end region 22, the plurality of ground pads 38 are disposed so as to interpose the group of signal pads 40 therebetween in the second direction D2.

The group of signal pads 40 (some of the plurality of end pads 36) located in the first end region 20 and the group of signal pads 40 (at least some of the plurality of end pads 36) located in the second end region 22 are connected through a plurality of first wiring lines 44. The plurality of first wiring lines 44 are straight at least in their intermediate portions. The plurality of first wiring lines 44 are included in the wiring pattern 28. The plurality of first wiring lines 44 overlap the ground plane 34 so as to allow a dielectric to be present therebetween, and constitute a microstrip line. Further, the plurality of first wiring lines 44 constitute a multichannel differential transmission path, and is configured so as to allow a signal of 10 Gbps or more to transmit therethrough.

The plurality of terminals 30 include a plurality of side pads 46. The plurality of side pads 46 are located at at least one of (e.g., both) the pair of side edges 26 of the base material 18. The plurality of side pads 46 are arranged in the first direction D1. The plurality of side pads 46 are located at a position closer to one of the first end region 20 and the second end region 22 than the other, for example, at a position closer to the second end region 22 than the first end region 20.

The wiring pattern 28 includes a plurality of second wiring lines 48. The plurality of second wiring lines 48 connect the group of control pads 42 (some of the plurality of end pads 36) located in the first end region 20 with the plurality of side pads 46. A signal or DC voltage (the signal or voltage to drive or control the optical subassembly 14) of 1 MHz or less is input to the plurality of side pads 46 and transferred to the group of control pads 42. As shown in FIG. 4, the printed circuit board 10 is connected to the plurality of end pads 36 located in the second end region 22 and also connected to the plurality of side pads 46 located in the intermediate region 24. The plurality of end pads 36 and the plurality of side pads 46 are electrically and physically joined to the printed circuit board 10 by solder or the like. Here, the side pad 46 is disposed on the inner side in the second direction D2 than the region where the plurality of end pads 36 are disposed, and therefore, the region for disposing the flexible printed circuit board 12 is effectively the region where the plurality of end pads 36 are disposed. With this configuration, it is possible to increase the number of connection terminals to the printed circuit board 10 without expanding the region for disposing the flexible printed circuit board 12.

According to the embodiment, the side pad 46 is also used for electrical connection, and therefore, the number of end pads 36 arranged in the second direction D2 (width direction) can be reduced, which can reduce widening of the width of the flexible printed circuit board 12.

While there have been described what are at present considered to be certain embodiments of the invention, it will be understood that various modifications may be made thereto, and it is intended that the appended claims cover all such modifications as fall within the true spirit and scope of the invention. For example, the side pad 46 may also be provided at a position closer to the first end region 20. Moreover, the plurality of side pads 46 may be one side pad 46.

What is claimed is:

1. An optical module comprising:
   an optical subassembly for converting an optical signal and an electric signal from at least one to the other;
   a printed circuit board; and
   a flexible printed circuit board connecting the optical subassembly with the printed circuit board,
   the flexible printed circuit board including a base material and a wiring pattern, the wiring pattern including a plurality of terminals at a periphery on at least one surface of the base material,
   the base material including a pair of end regions located on both sides in a first direction, and an intermediate region located between the pair of end regions,
   the intermediate region including a pair of side edges on both sides in a second direction orthogonal to the first direction, both the pair of side edges not projecting outward in the second direction from the pair of end regions, at least one of the pair of side edges having a shape recessed inward in the second direction from the pair of end regions,
   the plurality of terminals including a plurality of end pads and a side pad, the plurality of end pads being located in each of the pair of end regions of the base material and arranged in the second direction, the side pad being located at the at least one of the pair of side edges of the base material.

2. The optical module according to claim 1, wherein the side pad is a plurality of side pads located at the at least one of the pair of side edges of the base material and arranged in the first direction.

3. The optical module according to claim 2, wherein the pair of end regions include a first end region and a second end region, and
   the wiring pattern includes a plurality of wiring lines connecting some of the plurality of end pads located in the first end region with at least some of the plurality of end pads located in the second end region.

4. The optical module according to claim 3, wherein the plurality of wiring lines are configured so as to allow a signal of 10 Gbps or more to transmit therethrough.

5. The optical module according to claim 4, wherein the plurality of wiring lines constitute a multichannel differential transmission path.

6. The optical module according to claim 3, wherein the wiring pattern includes a ground plane, and
   the plurality of end pads include a group of signal pads connected to the plurality of wiring lines, and a plurality of ground pads connected to the ground plane.

7. The optical module according to claim 6, wherein the plurality of ground pads are disposed so as to interpose the group of signal pads therebetween in the second direction.

8. The optical module according to claim 6, wherein the plurality of end pads located in the first end region include a group of control pads, and
   the wiring pattern includes another plurality of wiring lines connecting the group of control pads with the plurality of side pads.

9. The optical module according to claim 8, wherein the plurality of ground pads located in the first end region are disposed so as to interpose the group of control pads therebetween in the second direction.

10. The optical module according to claim 9, wherein at least one of the ground pads is disposed between the group of signal pads and the group of control pads located in the first end region.

11. The optical module according to claim 3, wherein the plurality of side pads are located at a position closer to the second end region than the first end region.

12. The optical module according to claim 3, wherein the first end region is larger in the second direction than the second end region.

13. The optical module according to claim 2, wherein both the pair of side edges of the intermediate region have a shape recessed inward in the second direction from the pair of end regions.

14. The optical module according to claim 2, wherein the optical subassembly is connected to the plurality of end pads located in the first end region, and
    the printed circuit board is connected to the plurality of end pads located in the second end region and the plurality of side pads located in the intermediate region.

15. The optical module according to claim 2, wherein the plurality of side pads are configured so as to allow a signal or DC voltage of 1 MHz or less to be input thereto.

16. A flexible printed circuit board comprising:
    a base material; and
    a wiring pattern including a plurality of terminals at a periphery on at least one surface of the base material,
    the base material including a pair of end regions located on both sides in a first direction, and an intermediate region located between the pair of end regions,
    the intermediate region including a pair of side edges on both sides in a second direction orthogonal to the first direction, both the pair of side edges not projecting outward in the second direction from the pair of end regions, at least one of the pair of side edges having a shape recessed inward in the second direction from the pair of end regions,
    the plurality of terminals including a plurality of end pads and a plurality of side pads, the plurality of end pads being located in each of the pair of end regions of the base material and arranged in the second direction, the plurality of side pads being located at the at least one of the pair of side edges of the base material and arranged in the first direction.

* * * * *